United States Patent [19]

Robinson et al.

[11] Patent Number: 4,580,091

[45] Date of Patent: Apr. 1, 1986

[54] CONTINUITY TESTER

[75] Inventors: David G. Robinson, Alton; Ian K. Baker, East Horsley, both of England

[73] Assignee: Delta Research Limited, Andover, England

[21] Appl. No.: 596,008

[22] Filed: Apr. 2, 1984

[30] Foreign Application Priority Data

Apr. 14, 1983 [GB] United Kingdom ............... 8310183

[51] Int. Cl.$^4$ ................................. G01R 31/08
[52] U.S. Cl. ........................................ 324/51; 324/62
[58] Field of Search ......................... 324/51, 62, 65 R

[56] References Cited

U.S. PATENT DOCUMENTS

| | | | |
|---|---|---|---|
| 3,284,707 | 11/1966 | Clinton | 324/62 |
| 3,551,796 | 12/1970 | Holder et al. | 324/62 X |
| 3,689,832 | 9/1972 | Leto et al. | 324/65 R |
| 3,758,855 | 9/1973 | Meyer | 324/65 R |
| 3,870,034 | 3/1975 | James | 324/62 X |
| 3,872,384 | 3/1975 | Laass | 324/62 X |
| 3,901,214 | 8/1975 | Taaffe | 324/62 X |
| 4,163,936 | 8/1979 | Shufro | 324/62 X |

Primary Examiner—Stanley T. Krawczewicz
Attorney, Agent, or Firm—Charles R. Mattenson

[57] ABSTRACT

The present invention provides a continuity tester comprising a D.C. coupled amplifier for providing a voltage to a transducer through a voltage threshold means, an A.C. attenuator for providing positive feedback to the amplifier, a first resistor connected between the input and the output of the amplifier and a second resistor connected in series with the transducer between the input and the output of the amplifier, the first and second resistors providing negative feedback to the amplifier, and means for connecting a circuit to be tested in parallel across the second resistor, whereby if the impedance of the test circuit is below a predetermined value, the amplifier becomes unstable and causes the transducer to produce a signal whose frequency is dependent on the impedance of the test circuit.

4 Claims, 1 Drawing Figure

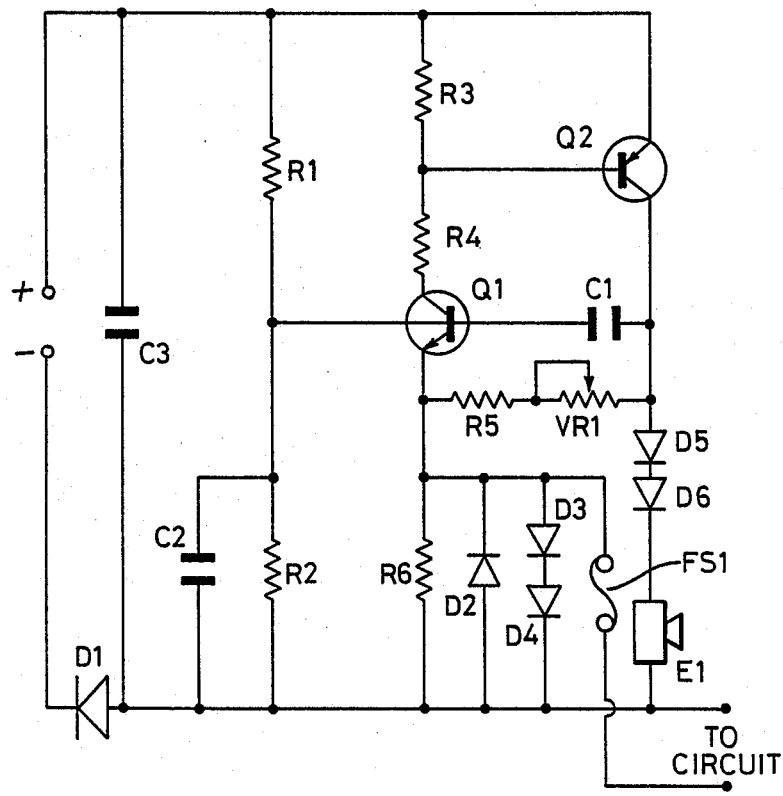

CONTINUITY TESTER

The present invention relates to a continuity tester for testing the continuity of electrical circuits. The tester is envisaged as being of particular, but not exclusive, use in the testing of circuits involving semiconductor devices.

According to the present invention, there is provided a continuity tester comprising a DC coupled amplifier for providing a voltage to a transducer through a voltage threshold means, an A.C. attenuator for providing positive feedback to the amplifier, a first resistor connected between the inlet and the outlet of the amplifier and a second resistor connected in series with the transducer between the input and the output of the amplifier, the first and second resistors providing negative feedback to the amplifier, and means for connecting a circuit to be tested in parallel across the second resistor, whereby if the impedance of the test circuit is below a predetermined value, the amplifier becomes unstable and cause the transducer to produce a signal whose frequency is dependent on the impedance of the test circuit.

Preferably, the transducer produces an audible signal and the D.C. amplifier comprises two transistors.

A preferred embodiment of the present invention is now described, by way of example only, with reference to the single accompanying drawing which shows a circuit diagram of a continuity tester according to the invention.

In the preferred embodiment of the invention shown in the drawing, transistors Q1 and Q2 form a D.C. coupled amplifier. Resistors R1 and R2 set the D.C. operating point for the base of transistor Q1.

Transistor Q1 has D.C. negative feedback applied to its emitter from the collector of transistor Q2, preferably via variable resistor VR1 and resistor R5 in conjunction with resistor R6. Variable resistor VR1 allows the amount of negative feedback applied to transistor Q1 to be varied over a limited range by the user for the purposes of reference setting.

A pair of probes or similar devices (not shown) for connecting the tester to the circuit under test are connected across resistor R6 so that, in use, the circuit under test is shunted across resistor R6.

The collector of transistor Q1 is connected to the base of transistor Q2 via resistor R4. Resistor R3 provides a return path for the collector-base current of transistor Q2 when the circuit is in quiescent condition, thus providing good temperature stability in use and low supply current drain when in standby under elevated temperature conditions:

The collector of transistor Q2 is connected to a transducer E1, shown in this embodiment as an acoustic transducer, through a voltage thresholding means. In the present case, the thresholding means comprises diodes D5 and D6. It will be appreciated that other transducers and thresholding means could also be used in a circuit according to the invention.

The quiescent voltage at the collector of transistor Q2 is arranged to be below the threshold voltage of diodes D5 and D6 so that there is a low standby current drain.

The collector of transistor Q2 is also connected through capacitor C1 to the base of transistor Q1 to provide a limited amount of positive feedback to transistor Q1. The amount of feedback is limited by capacitor C2 which forms an A.C. attenuator in conjunction with capacitor C1. In the present embodiment the capacitors C1 and C2 form a 10:1 attenuator.

Preferably, the circuit is designed for battery operation, for instance from a commercially available dry cell 9 v battery, so that the tester is portable. In this case capacitor C3 is provided to ensure that the dynamic impedance of the supply remains low, so ensuring stable operation over the useful life of the battery.

Preferably, the circuit also includes diode D1 for preventing damage occuring to the circuit due to accidental reversal of the supply connections. Under such conditions the diode D1 becomes reversed biased, thus blocking current flow.

The circuit preferably also includes diodes D2, D3 and D4 and fuse FS1 to protect the circuit in use in the event of the probes being connected to circuitry bearing potentially damaging voltage. If a negative voltage is applied from the circuit, diode D2 conducts and if the voltage is positive diodes D3 and D4 conduct.

If the circuit under test is able to deliver damaging current to the tester, causing current to flow in either diode D2 or diodes D3 and D4, fuse FS1 ruptures, thus disconnecting the tester circuit from the external circuit and so preventing damage to both the tester and the circuit under test.

The circuit shown in the drawing can be arranged to operate using a 9 v battery if the components have the values given in the table below.

TABLE

| COMPONENT | VALUE OR TYPE |
|---|---|
| Q1 | BC 184 |
| Q2 | BC 214 |
| $R_1$ | 2 M 2 ohm |
| $R_2$ | 200K ohm |
| $R_3$ | 10K ohm |
| $R_4$ | 10K ohm |
| $R_5$ | 220 ohm |
| $R_6$ | 15K ohm |
| VR1 | 470 ohm (variable) |
| C1 | 10 nanofarads |
| C2 | 100 nanofarads |
| C3 | 100 micro farads |
| D1 to D6 | IN 4148 |
| FS1 | 50 mA fast blow |
| E1 | Magnetic Earpiece 250 ohm |

This circuit provides an open terminal voltage at the probes of no more than 270 mV, thus enabling it to be safely used on circuits including MOS and other semiconductor devices which, typically, can withstand reverse voltages at their junctions of about 300 mV.

This circuit also takes a low quiescent current (typically about 22 micro amps) so that no on/off switch is required.

In use, the tester operates as follows. With nothing connected across resistor R6 via the probes, the circuit is in a quiescent state in which the negative feedback is greater than the positive feedback. The D.C. coupled amplifier formed by transistors Q1 and Q2 is therefore stable.

However, under test conditions, the circuit to be tested is connected across the resistor R6 via the probes. If the test circuit is not continuous, the condition of the tester circuit is unchanged. However, if the test circuit is continuous, the amount of negative feedback is reduced. If the impedance of the test circuit is low enough, the positive feedback will become greater than the negative feedback.

Noise from partition effects within the various circuit components and Schott noise within the semiconductors provides enough impulsive effects to start oscillation of the amplifier once the positive feedback is greater than the negative feedback. In this condition transistor Q1 switches, so driving transistor Q2 into a switching state. When the voltage at the collector of transistor Q2 exceeds the threshold voltage of diodes D5 and D6, current flows in transducer E1, resulting in the emission of a signal. (In the described embodiment, the signal is an audible tone).

As transistor Q2 is switched on, the negative feedback to transistor Q1 is increased and eventually reaches the point at which Q1 is switched off. This in turn causes transistor Q2 to switch off, and the base of transistor Q1 is driven negative via the capacitor C1.

Capacitor C1 discharges via resistor R2, allowing the base of transistor Q1 to rise to the original voltage at which switching occurred.

If the test circuit applied across resistor R6 has not changed in condition, switching will still be able to occur, thus causing the operation described above to occur cyclically. The net effect is to produce a signal at E1 (an audible tone) at a frequency related to the net depression of the negative feedback by the test circuit.

In the circuit described above for use with a 9 v battery, the change in frequency for a given change in feedback is quite large. Thus a relatively small change in the external load impedance provided by the test circuit can easily be distinguished by a change in the signal frequency (audible tone), higher impedance increasing the signal frequency, lower impedance decreasing the signal frequency.

Thus the preferred embodiment of the invention can not only establish the continuity of the test circuit, but can also give an audible indication of the quality of the continuity.

The change in signal frequency with change in impedance can be utilised advantageously to localise a short circuit on a printed circuit board, for instance by placing the probes at various locations on the conductive tracks of the board and observing the change in signal frequency with position.

Moreover, the tester can be used to distinguish between a resistive and a reactive circuit under test. If the test circuit includes a reactive component, once the resistive effect of the test circuit has caused transistor Q1 to switch, a current is caused to flow in the reactive component. If the test circuit includes a significant reactive component, the effect of the flow of current in the test circuit is to cause the audio tone to be depressed below that preset by variable resistor VR1 for a short circuit.

The depression of the tone rises rapidly with increasing inductance. In the tester circuit described above, if the inductance is above 1 mH, the frequency of the signal is in the sub-audio range. This is a valuable attribute of the present tester as it allows the tester circuit to be used for checking continuity on high current power supply wiring back as far as the supply transformer secondary winding with confidence with the correct circuit is being checked, (provided that the transformer secondary winding has an inductance greater than the critical value set by variable resistor VR1).

Using the tester circuit with the components suitable for use with a 9 v battery and an audible transducer E1, it is possible to discriminate resistance as low as 0.1 ohm. The circuit is safe for use with most semiconductor devices, such as MOS and CMOS devices and is internally protected against accidental connection to live circuitry. It is simple for use and has a long battery life. It may be made of small, compact and rugged construction, thus enabling it to be used in field services.

In a preferred embodiment, the transducer E1 is arranged to produce an audible signal in an earpiece. In this embodiment it will be possible to use the tester in environment having a high level of ambient noise, such as a factory or busy laboratory, without the noise preventing the operator using the tester effectively.

The absence of an on/off switch in the tester is also an advantage as the tester is always ready for immediate use without significantly reducing the operation life of the battery.

It will be appreciated by a skilled person that other components and devices may be used in the test circuit, depending on the type of circuit tested and the conditions under which the testing is to be carried out, without departing from the scope of the invention.

We claim:

1. A continuity tester comprising a D.C. coupled amplifier for providing a voltage to a transducer through a voltage threshold, an A.C. attenuator for providing positive feedback to the amplifier, a first resistor connected between the input and the output of the amplifier and a second resistor connected in series with the transducer between the input and the output of the amplifier, the first and second resistors providing negative feedback to the amplifier and forming a bridge circuit, and means for connecting a circuit to be tested in parallel across the second resistor of said bridge circuit, whereby if the impedance of the test circuit is below a predetermined value, the amplifier becomes unstable and causes the transducer to produce a signal whose frequency is dependent on the impedance of the test circuit.

2. A continuity tester according to claim 1, in which the transducer produces an audible signal.

3. A continuity tester according to claim 1, in which the D.C. coupled amplifier comprises two transistors.

4. A continuity tester according to claim 2, in which the D.C. coupled amplifier comprises two transistors.

* * * * *